Oct. 20, 1959 L. C. THOMAS 2,909,676

TRANSISTOR COMPARATOR CIRCUIT FOR ANALOG TO DIGITAL CODE CONVERSION

Filed Aug. 15, 1955 2 Sheets-Sheet 1

INVENTOR
L. C. THOMAS

BY [signature]

ATTORNEY

Oct. 20, 1959
L. C. THOMAS
TRANSISTOR COMPARATOR CIRCUIT FOR ANALOG TO DIGITAL CODE CONVERSION
2,909,676
Filed Aug. 15, 1955
2 Sheets-Sheet 2

INVENTOR
L. C. THOMAS
BY James D. Falk
ATTORNEY

United States Patent Office 2,909,676

Patented Oct. 20, 1959

2,909,676

TRANSISTOR COMPARATOR CIRCUIT FOR ANALOG TO DIGITAL CODE CONVERSION

Lewis C. Thomas, North Plainfield, N.J., assignor to Bell Telephone Laboratories, Incorporated, New York, N.Y., a corporation of New York Application August 15, 1955, Serial No. 528,283

12 Claims. (Cl. 307—88.5)

This invention relates to electrical circuits and more particularly to comparator circuits for analog-digital code conversion.

In electrical circuits it is often desirable to convert an analog voltage level to a pulse or a series of pulses that may be handled on a digital basis. This may be accomplished by in some way comparing the analog voltage value with a reference potential. Priorly, comparator circuits to accomplish this have employed vacuum tube networks involving differential amplifier and summing amplifier techniques. This latter method consists of using a high gain D.-C. feedback amplifier with a dual input to sum the two voltages to be compared. In such a technique output pulses are generated when the two inputs are equal.

These prior techniques have required relatively complex circuitry and have not been capable of attaining high degrees of accuracy in efficient and simple circuits.

It is a general object of this invention to provide an improved circuit for converting an analog voltage level to digital pulses.

It is another object of this invention to provide a comparator circuit for analog to digital code conversion employing transistors.

It is a further object of this invention to provide comparator circuits which are relatively simple and which yet have high degrees of accuracy, such as being capable of detecting variations of the order of 50 millivolts in a possible analog voltage level range of 100 volts.

In one specific embodiment of this invention a junction transistor having a current gain factor, $\alpha$, greater than unity is employed with three distinct voltage inputs. These input information signals include, first, a D.-C. bias signal or substantially D.-C. bias signal whose level is proportional to the analog information. This signal is designated $V_T$ and is actually a varying voltage, but for the time intervals with which the present discussion is concerned it can be considered to be a constant direct voltage. The input information signals include, secondly, a sawtooth voltage wave designated $V_S$ and adjusted to rise in a linear fashion over the entire possible voltage range of the signal voltage $V_T$ in a brief time. In one specific illustrative embodiment, further described below, wherein the signal voltage $V_T$ to be converted was possible of variation between plus and minus 50 volts, sawtooth wave $V_S$ was adjusted to rise in a linear fashion from $-50$ volts to $+50$ volts in approximately 15 milliseconds. The third voltage applied to the emitter comprises a pulse train $V_P$, which in this specific embodiment had a repetition rate of 100 kilocycles and a pulse duration of 5 microseconds. The amplitude of these pulses is not critical but in this specific embodiment was 0.1 volt.

The analog voltage $V_T$ and the sawtooth wave $V_S$ are applied to the emitter through high resistances so that there is substantially no current flow due to these voltages. The pulse train, however, is advantageously applied to the emitter directly through a capacitor so that the entire triggering power for the emitter is supplied solely by the pulse $V_P$.

By applying the three voltages simultaneously to the emitter of the transistor the linear sawtooth wave is quantized into discrete steps by the pulse train, and the quantized sawtooth wave and D.-C. analog information signal $V_T$ are then compared. In this specific embodiment the comparator circuit was designed to have a trigger sensitivity of one-half of a quantum step or of 50 millivolts in order to avoid ambiguity. Accordingly, whenever the quantized sawtooth wave, which is the sum of $V_S$ and $V_P$, exceeds a threshold proportional to $V_T$ by 50 millivolts, a discrete output pulse is to be obtained. The position of this output pulse in the single cycle identified by the sawtooth wave indicates the value of the analog voltage $V_T$ being compared.

This output pulse may be employed to trigger a bistable network to disable a diode gate directly connected to the source of the quantizing pulses $V_P$. Then the number of such quantizing pulses $V_P$ passed by the gate will be an additional indication of the original value of the analog voltage being compared.

In another specific illustrative embodiment of this invention in place of the single junction type transistor a pair of junction transistors in an n-p-n—p-n-p combination transistor arrangement may be employed. Such a transistor arrangement is disclosed in the article "Four Terminal P-N-P-N Transistors," by J. J. Ebers in the Proceedings of the I.R.E., volume 40, No. 11, pages 1361 to 1364.

It is a feature of this invention that a transistor be employed in an analog to digital code comparator circuit having applied to its emitter the analog voltage to be compared, a sawtooth comparing voltage which is swept over the entire possible voltage range of the analog voltage in a repetitious cycle, and a series of quantizing pulses applied at a large number of times during this cycle so that the comparison is made between the analog voltage applied to the emitter and the sum of the sawtooth varying voltage and the quantizing pulses.

It is another feature of this invention that the analog voltage to be compared and the sawtooth voltage both be applied through high impedances so that they are in effect high impedance bias voltage sources from which very little current may be drawn and the major portion of the energy required for triggering the comparer transistor is supplied by the quantizing pulse.

It is a further feature of this invention that the comparator circuit have a trigger sensitivity of the order of millivolts, even though the possible voltage range of the analog voltage is of the order of tens or hundreds of volts or more.

A complete understanding of these and other desirable features of this invention may be gained from consideration of the following detailed description, together with the accompanying drawing, in which.

Figure 1:
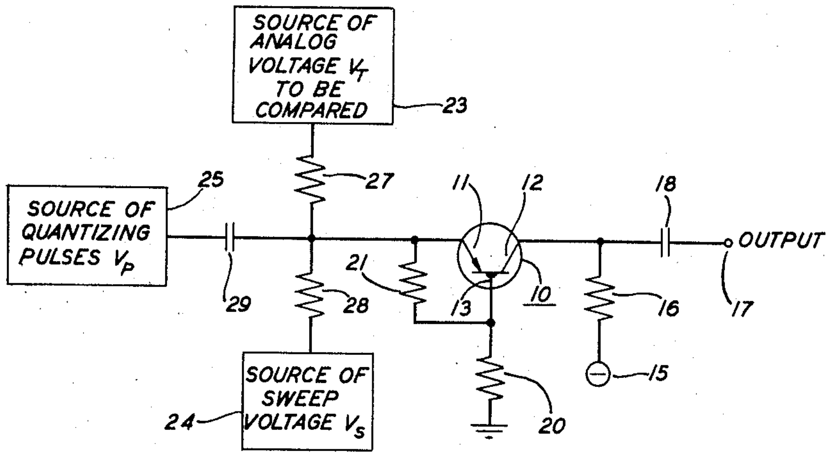
Fig. 1 is a schematic diagram of a compartor circuit in accordance with one specific illustrative embodiment of this invention.

Turning now to the drawing, the specific illustrative embodiment of this invention depicted in Fig. 1 comprises a p-n-p junction transistor 10 having a current gain factor alpha greater than unity and comprising an emitter 11, a collector 12, and a base 13. Connected to the collector 12 are a source of collector potential 15 which may be of the order of −4.5 volts through a load resistance 16 which may be of the order of 10,000 ohms, and an output terminal 17 through a condenser 18. The base of the transistor 13 is connected to ground through a base resistance 20 and to the emitter 11 through a feedback resistor 21, thereby defining a trigger circuit which is advantageously monostable, generating a single output pulse on application of a triggering pulse to the emitter 11. In such a triggering circuit, as is known in the art, the transistor should advantageously have a current gain factor alpha greater than unity. Accordingly, point contact type transistors may be employed. However, I have found that when the comparator circuit is to be triggered by very small increments in the voltage level, as of the order of 50 millivolts, the triggering sensitivity of point contact transistors tends to prevent this high accuracy being consistently attained. However, if such accuracy is not required, point contact transistors may be employed. Further, it is apparent that not all junction transistors may be employed, but only such which, due to their collector characteristics, as is known in the art, have alphas greater than unity.

Connected to the emitter 11 in accordance with this invention are a source 23 of analog voltage $V_T$ which is to be compared, a source 24 of sweep voltage $V_S$, and a source 25 of quantizing pulses $V_P$. The analog voltage $V_T$ is applied through a high resistor 27 and the sweep voltage $V_S$ through a high resistor 28 which resistors may be of the order of 200,000 ohms or more whereby the sources are effectively high impedance sources with substantially no current flowing from them to the emitter 11. The quantizing pulses $V_P$ are, however, applied to the emitter through a condenser 29 so that substantially all the power and current applied to the emitter 11 come from the quantizing pulses $V_P$.

Figure 2:
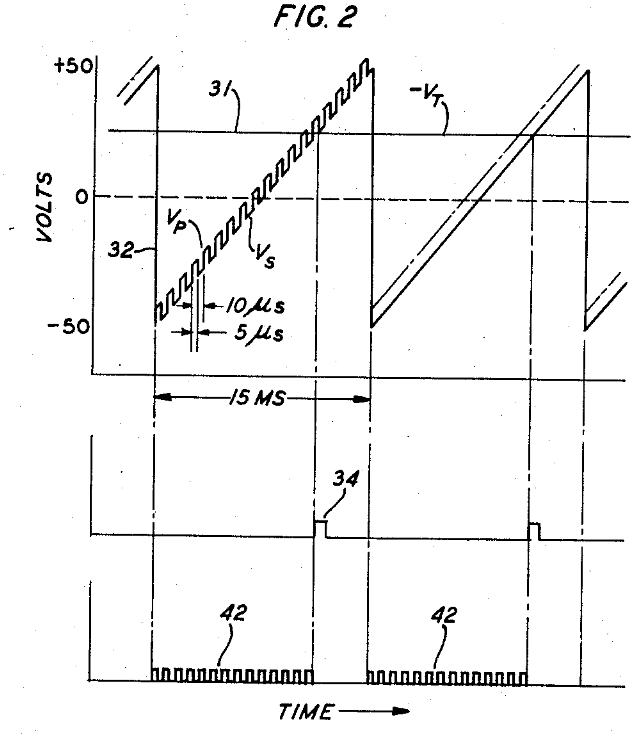
Fig. 2 is a time plot of the three voltages applied to the emitter of the transistor in accordance with this invention and indicating the occurrence of output pulses from the comparator circuit.

The operation of this specific embodiment of the invention can best be seen by the plot of Fig. 2, wherein are depicted a curve 31 illustrative of one value of analog voltage level $V_T$, and a sweep voltage curve 32 illustrative of the sweep voltage $V_S$. Although the particular value of $V_T$ selected as illustrative is negative in this example, curve 31 has been depicted as positive so that the location of the pulse 34 along the time base in the diagram may be more readily apparent. The sweep voltage $V_S$ repetitively varies linearly in value over the possible range of the analog voltage $V_T$, which in this embodiment is assumed to be from −50 volts to +50 volts, and one cycle of this sweep occurs each 15 milliseconds. The quantizing pulses $V_P$ are applied once every 10 microseconds and are of a duration of 5 microseconds each. In this specific embodiment the quantizing pulses had an amplitude of 100 millivolts and the triggering sensitivity of the transistor 10 was arranged so that the transistor would be triggered whenever the voltage applied thereto by the sum of the quantizing and sweep voltages was 50 millivolts more than the analog voltage $V_T$. When this occurs, an output pulse 34 is generated and appears at the output terminal 17. This output pulse 34 in this specific embodiment is of approximately 4 volts and 40 microseconds long and appears at the output terminal 17 across the collector load resistor 16.

It is therefore apparent that in accordance with this invention the quantizing input voltage alone provides the energy necessary to initiate the triggering of the transistor while the two inputs to be compared, namely $V_P$ and $V_T$ merely set the instantaneous conditions necessary for triggering. The duration and shape of the output pulse is controlled by the transistor circuit constants and is not a function of the shape or duration of the input signals. Further, exceedingly small voltage changes may be detected so that accuracy within changes of analog voltage level $V_T$ of the order of millivolts in a large possible voltage range as of the order of 100 volts may be readily detected by means of simple circuitry.

Figure 3:
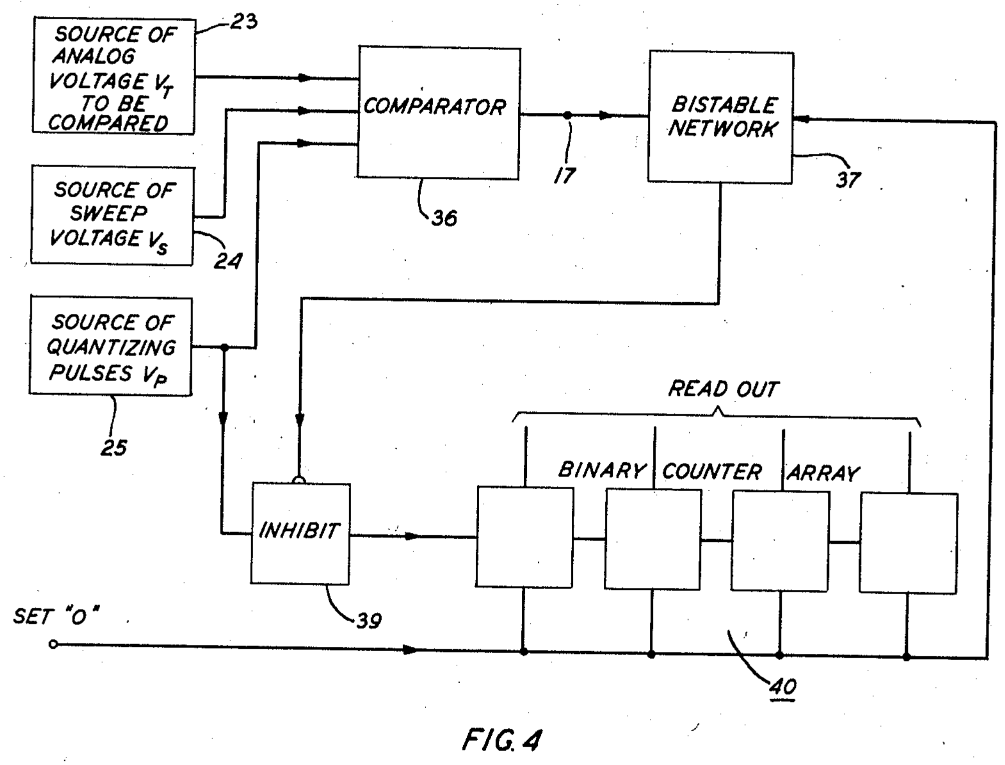
Fig. 3 is a block diagram of one encoder for analog to binary code conversion employing comparators in accordance with this invention.

In order to convert from an analog voltage to a binary code a comparator circuit in accordance with this invention may be employed, together with other circuit elements, as disclosed in Fig. 3. As there seen, the output terminal 17 of a comparator circuit 36, which may advantageously be as depicted in Fig. 1, is applied to a bistable network 37 which may be a conventional transistor circuit. The amplitude and duration of the output pulse 34 are sufficient to control this circuit 37. The quantizing pulses $V_P$ from source 25 are applied simultaneously to the comparator circuit 36 as described above and through an inhibit gate 39 to a binary counter 40 which may be of a conventional type. When the bistable network is triggered by the output pulse 34, gate 39 serves to inhibit subsequent passage of quantizing pulses to the binary counter.

Turning again to Fig. 2, the output of gate 39 is there depicted as the trains of pulses 42 for the specific voltage level 31 being compared. Accordingly, the output of the binary counter 40 comprises a binary representation of the original analog voltage level. Advantageously both the bistable network 37 and the individual stages of the binary counter 40 are reset to zero at the beginning of each cycle of the sweep voltage $V_S$.

Figure 4:
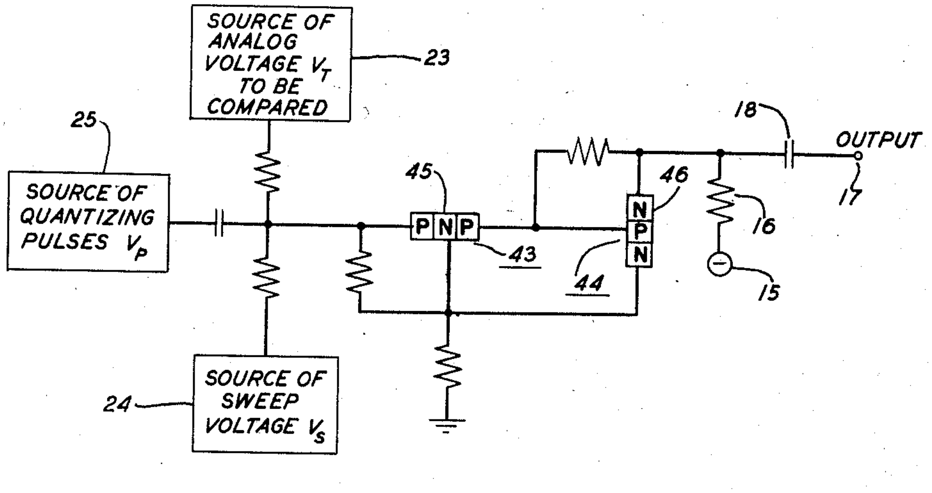
Fig. 4 is a schematic diagram of another specific illustrative embodiment employing combinational transistors.

In the specific illustrative embodiment of the invention depicted in Fig. 4 a pair of junction transistors 43 and 44, each having alphas less than unity, are connected in a combinational array whereby the over-all alpha of the transistor network thus defined is greater than unity. The input voltages $V_T$, $V_S$, and $V_P$ are applied to the emitter 45 of the first transistor 43, which is advantageously a p–n–p transistor; and the output 17 is connected to the emitter 46 of the second transistor 44, which is advantageously an n–p–n transistor.

It is to be understood that the above-described arrangements are merely illustrative of the application of the principles of this invention and that various modifications may be made by those skilled in the art without departing from the spirit and scope of the invention.

What is claimed is:

1. A comparator circuit for converting an analog voltage level into a digital pulse comprising transistor means including an emitter, high impedance means applying the analog voltage level to said emitter, high impedance means applying a sweep voltage to said emitter, said voltage being swept repetitively over the range of possible values of said analog voltage level, and low impedance means applying a train of quantizing pulses to said emitter, said transistor means being triggered when the sum of the sweep voltage and the quantizing pulse exceeds the analog voltage level by a predetermined amount and substantially the total power for triggering said transistor means being supplied from said quantized pulse source.

2. A comparator circuit for converting an analog voltage level into a digital pulse in accordance with claim 1 wherein said transistor means comprising a junction transistor having a current gain factor alpha greater than unity and including a collector and a base and output means connected to said collector.

3. A comparator circuit for converting an analog voltage level into a digital pulse in accordance with claim 1 wherein said transistor means comprises a pair of junction transistors each having a current gain factor alpha less than unity and each including an emitter, collector, and base, said voltages being applied to the emitter of said first transistor and said collector of said first transistor being connected to said base of said second transistor, wherein said transistor means has a current gain factor alpha greater than unity, and output means connected to said emitter of said second transistor.

4. A comparator circuit for converting an analog voltage level into a digital pulse comprising transistor means including an emitter, a first resistor and a second resistor connected to said emitter, means applying the analog voltage to be compared to said first resistor, means applying a sweep voltage to said second resistor, said sweep voltage being swept repetitively over the range of possible values of said analog voltage level, and said first and second resistors being of high enough resistance so that substantially no current flows from said voltage means to said emitter, a capacitor connected to said emitter, and means applying a train of quantizing pulses to said capacitor, said transistor being triggered when the instantaneous sum of the sweep voltage and the quantizing pulse exceeds the analog voltage level a predetermined amount and substantially the entire current for said triggering being supplied to said emitter by said quantizing pulse.

5. A comparator circuit for converting an analog voltage into a digital pulse comprising transistor means including an emitter, means for applying an analog voltage to said emitter, and means for applying a quantized sweep voltage to said emitter, said transistor means being triggered when the quantized sweep voltage exceeds the analog voltage by a predetermined amount, said means for applying a quantized sweep voltage to said emitter including high impedance source means for suppying a sawtooth sweep voltage varying over the range of said analog voltage and low impedance means for applying quantizing pulses to said emitter.

6. A comparator circuit in accordance with claim 5 wherein said means for applying an analog voltage to said emitter includes high impedance source means and wherein said source of quantizing pulses includes means for supplying a major portion of the energy required for triggering said comparator circuit.

7. A comparator circuit in accordance with claim 6 wherein said transistor means has a sensitivity in the order of millivolts and wherein said source of analog voltage includes means for supplying a variable analog signal which is variable in the order of hundreds of volts and wherein said source of quantizing pulses includes means for supplying quantizing pulses of the order of millivolts.

8. An electrical circuit for converting an analog voltage to a digital representation comprising a trigger device having first and second stable states and a threshold potential above which said device shifts from one to the other of said stable states; said device further having input and output terminals; a source of analog voltage, a source of sweep voltage and a source of quantizing pulses connected to said input terminal; means causing the potential of said input terminal to vary by incremental steps over a range including said threshold potential; and means producing a pulse at said output terminal upon the shifting of said device from one said stable state to the other.

9. An electrical circuit as set forth in claim 8 wherein said potential varying means includes resistance means connecting said analog voltage source and said sweep voltage source to said input terminal to limit the current from said last-mentioned sources to a negligible value.

10. An electrical circuit as set forth in claim 9 wherein the connection between said source of quantizing pulses and said input terminal comprises low impedance means to cause said quantizing pulse source to provide substantially all of the driving energy required by said trigger device in shifting from said first to said second stable states.

11. An electrical circuit for converting an analog voltage to a digital representation comprising a trigger device having first and second stable states and a threshold potential above which said device shifts from one to the other of said stable states; said device further having input and output terminals; means causing the potential of said input terminal to vary by incremental steps over a range including said threshold potential, said last-mentioned means including a source of analog voltage, a source of sweep voltage and a source of quantizing pulses connected to said input terminal; a pulse counter; gating means connecting said pulse counter to said source of quantizing pulses, said gating means being controlled by said trigger device to prevent the passage of pulses from said quantizing pulse source to said pulse counter upon the shifting of said trigger device between its first and second stable states; and means for resetting said counter and said trigger device upon the initiation of a cycle of said sweep voltage.

12. An electrical circuit for converting an analog voltage to a digital representation comprising a trigger device having first and second stable states and a threshold potential above which said device shifts from one to the other of said stable states, said device further having input and output terminals, means causing the potential of said input terminal to vary by incremental steps over a range including said threshold potential, said last-mentioned means including a source of analog voltage, a source of sweep voltage, and a source of quantizing pulses, high impedance means connecting said source of said analog voltage and said source of sweep voltage to said input terminal, low impedance means connecting said source of quantizing pulses to said input terminal, a pulse counter, gating means connecting said pulse counter to said source of quantizing pulses, means providing control of said gating means from said trigger device output terminal to prevent the passage of pulses from said quantizing pulse source to said pulse counter upon the shifting of said trigger device between its first and second stable states, and means for resetting said counter and said trigger device upon the initiation of a cycle of said sweep voltage.

References Cited in the file of this patent

UNITED STATES PATENTS

| | | |
|---|---|---|
| 1,887,237 | Finch | Nov. 8, 1932 |
| 2,398,097 | Kent | Apr. 9, 1946 |
| 2,445,233 | Montgomery | July 13, 1948 |
| 2,620,448 | Wallace | Dec. 2, 1952 |

OTHER REFERENCES

Proceedings of the IRE, November 1952, vol. 40, No. 11, pages 1579, Fig. 12 and 1582, Fig. 19.

"Transistor Theory and Practice," by Rufus P. Turner, Gernsback Library, No. 51, page 58, Fig. 411.